(12) United States Patent
Holbery et al.

(10) Patent No.: US 10,772,197 B2
(45) Date of Patent: Sep. 8, 2020

(54) ELECTRONICALLY FUNCTIONAL YARN

(71) Applicant: Microsoft Technology Licensing, LLC, Redmond, WA (US)

(72) Inventors: James David Holbery, Bellevue, WA (US); Don Pasindu Vijai Lugoda, Colombo (LK); Kelly Marie Bogan, Redmond, WA (US); Siyuan Ma, Bothell, WA (US); Benjamin Sullivan, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/961,355

(22) Filed: Apr. 24, 2018

(65) Prior Publication Data

US 2019/0327832 A1  Oct. 24, 2019

(51) Int. Cl.
*H05K 1/03* (2006.01)
*D02G 3/36* (2006.01)
(Continued)

(52) U.S. Cl.
CPC .............. *H05K 1/038* (2013.01); *D02G 3/36* (2013.01); *D02G 3/38* (2013.01); *D02G 3/441* (2013.01); *H01B 7/18* (2013.01); *H01B 7/292* (2013.01); *H01B 13/0036* (2013.01); *H01B 13/22* (2013.01); *H05K 1/189* (2013.01); *H05K 3/0044* (2013.01); *H05K 3/284* (2013.01); *H05K 3/32* (2013.01); *H05K 3/4038* (2013.01); *H05K 9/0067* (2013.01); *A41B 1/08* (2013.01); *D10B 2401/041* (2013.01); *D10B 2401/16* (2013.01);
(Continued)

(58) Field of Classification Search
CPC ............ H05K 1/038; D02G 3/36; D02G 3/38; D02G 3/441
See application file for complete search history.

(56) References Cited

U.S. PATENT DOCUMENTS

| 4,323,895 A | * | 4/1982 | Coste | ................. H05B 33/0803 340/13.37 |
| 6,045,575 A | * | 4/2000 | Rosen | .................. A61N 5/0621 2/905 |

(Continued)

FOREIGN PATENT DOCUMENTS

| JP | 2007138378 A | 6/2007 |
| TW | 201124571 A | 7/2011 |
| WO | 2008080245 A2 | 7/2008 |

OTHER PUBLICATIONS

"Application as Filed in U.S. Appl. No. 15/707865", filed Sep. 18, 2017, 27 Pages.
(Continued)

*Primary Examiner* — Hoa C Nguyen
(74) *Attorney, Agent, or Firm* — Alleman Hall Creasman & Tuttle LLP

(57) ABSTRACT

Examples are disclosed that relate to electronically functional yarns. One example provides an electronically functional yarn comprising a core, a sheath at least partially surrounding the core, and an electronic circuit formed on the core. The circuit includes three or more control lines and more than three diode-containing circuit elements controllable by the three or more control lines, each circuit element being controllable via a corresponding set of two of the three or more control lines.

17 Claims, 9 Drawing Sheets

(51) Int. Cl.
| | |
|---|---|
| *H05K 1/18* | (2006.01) |
| *H01B 7/29* | (2006.01) |
| *H05K 9/00* | (2006.01) |
| *H05K 3/32* | (2006.01) |
| *H05K 3/00* | (2006.01) |
| *H01B 13/22* | (2006.01) |
| *H05K 3/40* | (2006.01) |
| *H05K 3/28* | (2006.01) |
| *H01B 13/00* | (2006.01) |
| *D02G 3/44* | (2006.01) |
| *D02G 3/38* | (2006.01) |
| *H01B 7/18* | (2006.01) |
| *G06F 3/01* | (2006.01) |
| *A41B 1/08* | (2006.01) |

(52) U.S. Cl.
CPC ...... *D10B 2501/04* (2013.01); *D10B 2503/04* (2013.01); *D10B 2505/08* (2013.01); *G06F 3/014* (2013.01); *H05K 2201/09681* (2013.01); *H05K 2201/10106* (2013.01); *H05K 2201/10121* (2013.01); *H05K 2201/10151* (2013.01); *H05K 2201/10174* (2013.01); *H05K 2203/0228* (2013.01)

(56) References Cited

U.S. PATENT DOCUMENTS

| | | | | |
|---|---|---|---|---|
| 8,282,232 | B2* | 10/2012 | Hsu | D03D 1/0088 362/103 |
| 8,536,075 | B2* | 9/2013 | Leonard | D02G 3/441 313/511 |
| 8,783,903 | B2 | 7/2014 | Bhattacharya et al. | |
| 8,984,747 | B2 | 3/2015 | Kim et al. | |
| 9,706,648 | B2 | 7/2017 | Zhou et al. | |
| 2004/0009729 | A1* | 1/2004 | Hill | D02G 3/441 442/208 |
| 2004/0057176 | A1* | 3/2004 | Dhawan | D02G 3/38 361/62 |
| 2005/0282009 | A1* | 12/2005 | Nusko | D02G 3/12 428/375 |
| 2006/0007059 | A1 | 1/2006 | Bell | |
| 2006/0048497 | A1* | 3/2006 | Bloch | D02G 3/06 57/230 |
| 2012/0007898 | A1* | 1/2012 | Pavicic | G09G 3/2088 345/690 |
| 2012/0118427 | A1 | 5/2012 | Brookstein et al. | |
| 2013/0176737 | A1* | 7/2013 | Zhou | H05K 1/038 362/249.06 |
| 2014/0170920 | A1* | 6/2014 | Manipatruni | D03D 1/0088 442/188 |
| 2014/0262478 | A1* | 9/2014 | Harris | H05K 9/009 174/393 |

OTHER PUBLICATIONS

Vervust, Thomas, "Stretchable and Washable Electronics for Embedding in Textiles", In Doctoral Dissertation of Gent University, Nov. 2012, 254 Pages.

Bariya, et al., "Wearable sweat sensors" Nature Electronics vol. 1, Mar. 9, 2018. 13 pages. Available at: https://www.nature.com/articles/s41928-018-0043-y?utm_campaign=editorspicksmar&utm_medium=email&utm_source=ISI&utm_content=natelectron.

Pemberton, et al., "Fabrication and Evaluation of a Micro(Bio)Sensor Array Chip for Multiple Parallel Measurements of Important Cell Biomarkers". Centre for Research in Biosciences. 2014. 14 pages. Available at: www.mdpi.com/1424-8220/14/11/20519/pdf.

"International Search Report and Written Opinion Issued in PCT Application No. PCT/US2019/026211", dated Aug. 28, 2019, 15 Pages.

* cited by examiner

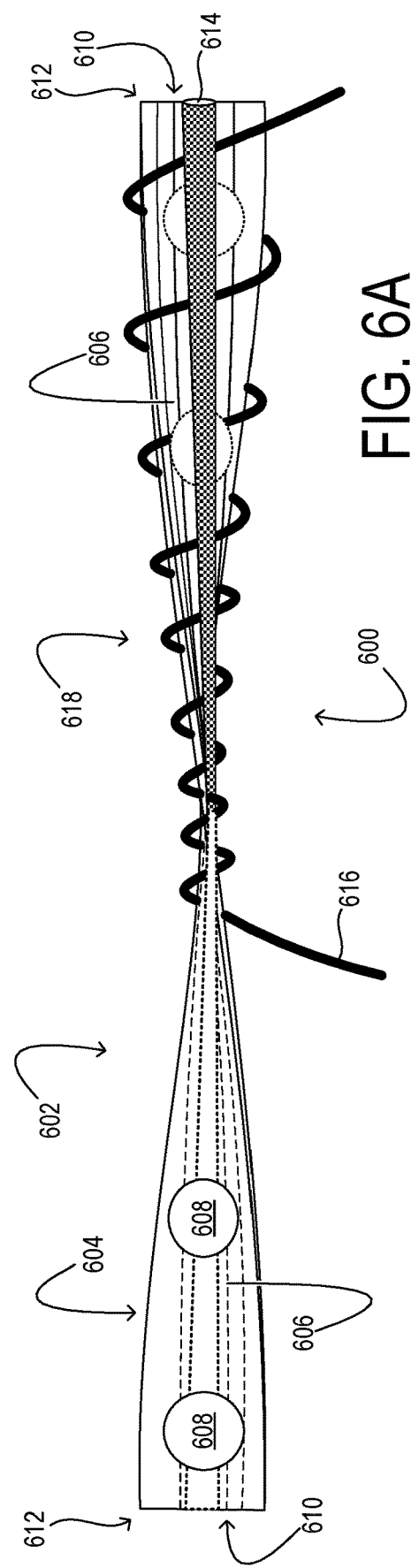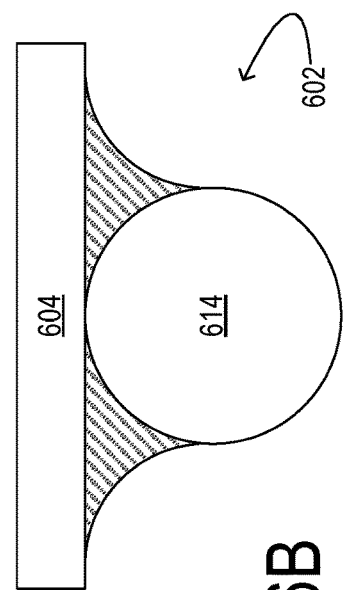
FIG. 6A
FIG. 6B

ELECTRONICALLY FUNCTIONAL YARN

BACKGROUND

A textile may be formed from a plurality of interlaced yarns. Textile yarns may take many different forms. Some yarns, which may be referred to as core-spun yarns, comprise a sheath formed around a central core. The sheath may be formed by twisting fibers or filaments around the central core.

SUMMARY

Examples are disclosed herein that relate to electronically functional yarns. One example provides an electronically functional yarn comprising a core, a sheath at least partially surrounding the core, and an electronic circuit formed on the core. The circuit includes three or more control lines and more than three diode-containing circuit elements controllable by the three or more control lines, each circuit element being controllable via a corresponding set of two of the three or more control lines.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIGS. 6A-6B show an example yarn core of an electronically functional yarn.

DETAILED DESCRIPTION

Electronic components may be incorporated into a textile article to form an electronically functional textile article. An electronically functional textile article may include any suitable electronic circuit elements. Examples include input devices (e.g. an optical sensor, a capacitive sensor, a resistive sensor, an acoustic sensor, a pressure sensor, a temperature sensor, a chemical sensor (e.g., for sensing gases such as $NO_x$, $CO_2$, and/or $O_2$), or a haptic actuation device (e.g. a button, switch, and/or other physical interface)), output devices (e.g. light-emitting diodes (LEDs), haptic feedback devices (e.g. a vibro-motor or other actuator), and also other circuitry, such as an antenna for transmitting and/or receiving data, control circuitry such as a memory component and processing component (e.g., a microprocessor configured to execute applications), and power supply circuitry (e.g. one or more batteries, one or more solar cells, etc.).

Figure 1A:
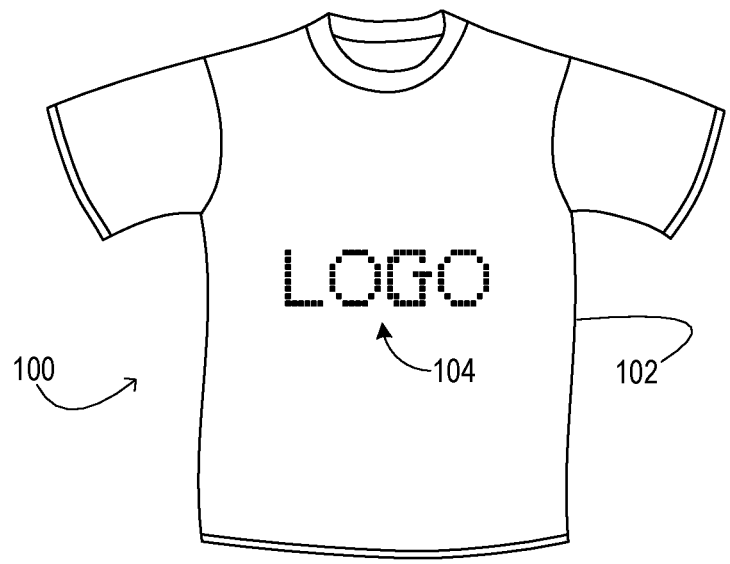
FIGS. 1A-1C show aspects of an example electronically functional textile article in the form of an item of clothing comprising integrated light sources.
Figure 1B:
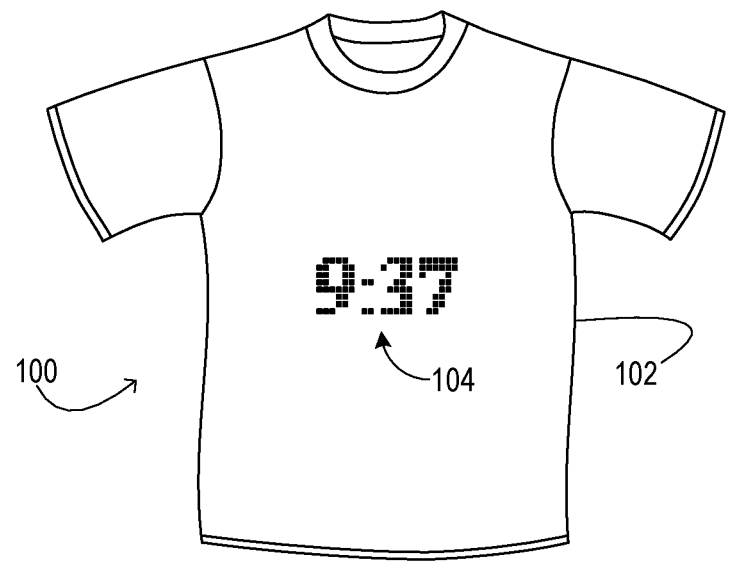
Figure 1C:
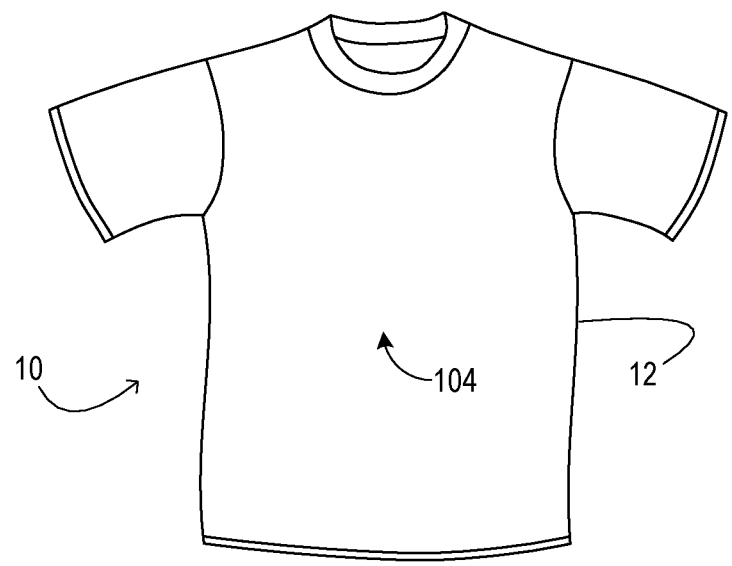

FIGS. 1A-1C show aspects of an electronically functional clothing article 100 formed at least partially from an electronically functional textile 102. Although article 100 takes the form of a shirt, this disclosure applies equally to other electronically functional textile articles and devices, such as soft-touch computing devices comprising textile exterior surfaces, wearable computing devices (e.g. head-mounted displays, functional gloves (e.g. a glove configured as a control device and/or output device for a computing system), wrist-worn devices, upholstery for furnishings, wall hangings, signage and other information displays, and internet of things (IOT) devices.

In this example, clothing article 100 comprises a plurality of LEDs that form a display 104. In the state represented in FIG. 1A, display 104 outputs graphical content in the form of text. In the state represented in FIG. 1B, display 104 outputs graphical content in the form of a current time ("9:37"). FIG. 1C represents a state in which the display 104 is not outputting any displayed content. In this state, the plurality of LEDs—and thus the overall display 104—may be relatively imperceptible.

Figure 2:
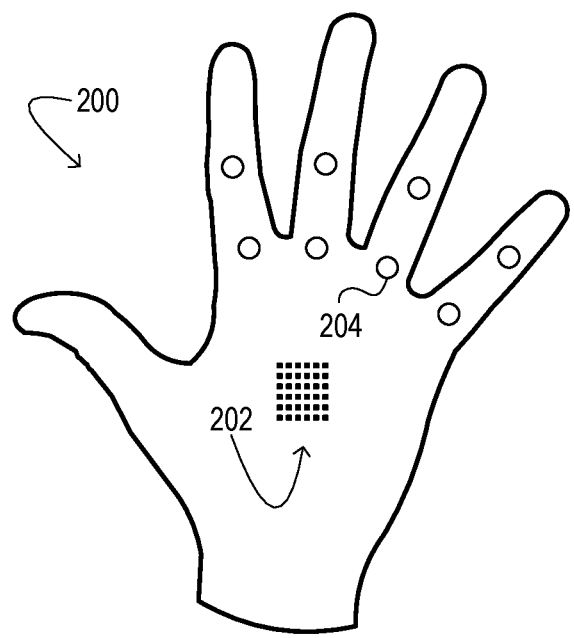
FIG. 2 shows another example electronically functional textile article in the form of an electronically functional glove.

As another example, FIG. 2 shows an example electronically functional glove 200. Glove 200 may comprise various sensors, user input devices, and/or output devices incorporated directly into the textile of the glove via one or more electronically functional yarn segments. As examples, FIG. 2 shows an array 202 of LEDs arranged on glove 200, and a plurality of motion sensors 204 arranged over the knuckle regions of the glove. It will be understood that these components are described as examples, and that any suitable electronic components may be used in an electronically functional glove or other electronically functional article.

Figure 3:
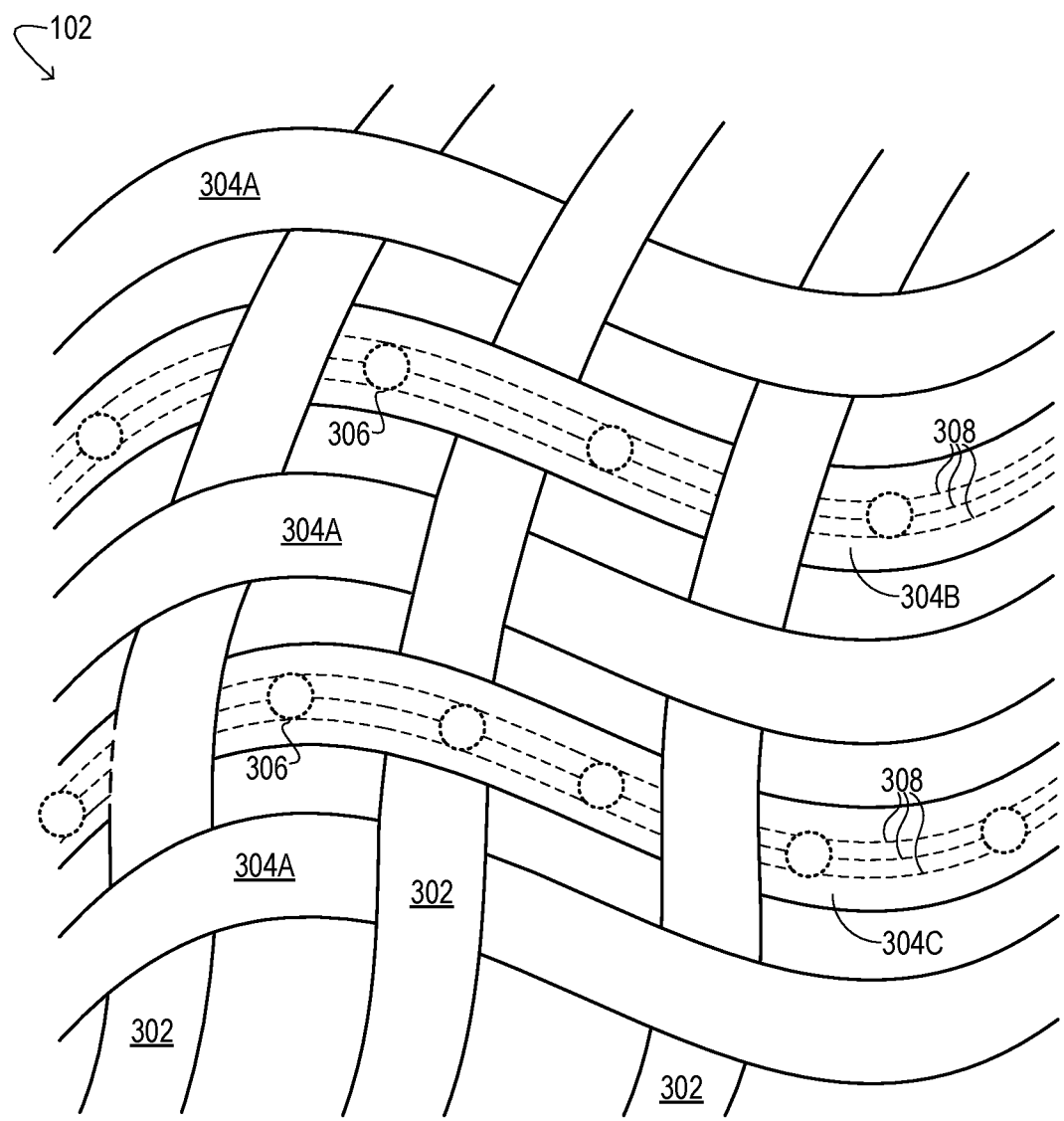
FIG. 3 shows aspects of an example electronically functional yarn.

An electronically functional yarn may be incorporated into an electronically functional textile in any suitable manner, such as by knitting, weaving or embroidery. FIG. 3 shows an example weave structure of textile 102. In the depicted example, textile 102 includes a series of mutually parallel warp yarns 302, and a series of mutually parallel weft yarns 304 running transverse to the warp yarns. Either or both series may include electronically functional yarns distributed among electronically non-functional yarns. As examples, FIG. 3 shows non-functional warp yarns 302 and non-functional weft yarn 304A integrated with electronically functional weft yarns 304B and 304C. FIG. 3 also illustrates electronic components 306 in electronically functional yarns 304B and 304C. Each component 306 may represent any suitable electronic component, including those described above. It will be noted that the sizes, locations, and general arrangement of components 306 are presented for example, and that any suitable arrangement of electronic component(s) on an electronically functional yarn may be used.

As yarns used to form textiles may be relatively narrow, it may be challenging to incorporate multiple individually-controllable electronic components into a yarn segment due at least in part to a number of control lines used to control the multiple components. Thus, as described in more detail below, the disclosed examples comprise diode-containing circuit elements to allow n control lines to control $n^2-n$ electrical components, thereby allowing a greater number of electronic elements to be controlled via a lesser number of control lines. In the depicted example, electronically functional yarns 304B and 304C each include three control lines 308 configured to carry electrical signals to the electronic component(s). Such control lines may be used to control six individual diode-containing circuit elements. Control lines 308 are shown as dashed lines to indicate that the control lines are actually located on a core of a core-sheath yarn structure, as described in more detail below.

Figure 4:
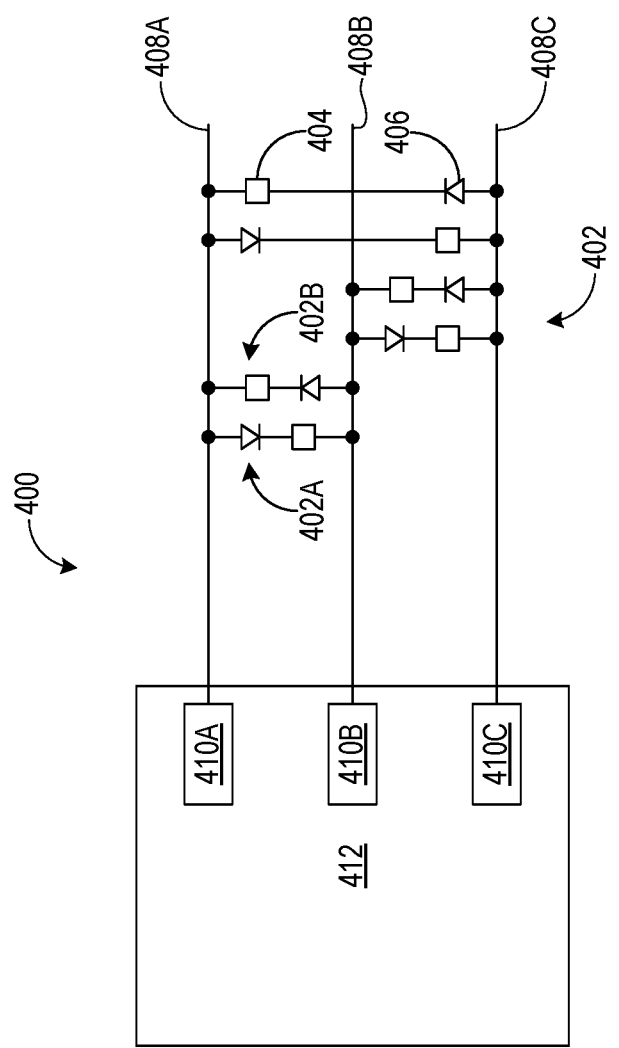
FIG. 4 schematically shows an example circuit for an electronically functional yarn.

FIG. 4 shows an example circuit 400 comprising a plurality of diode-containing circuit elements 402. As described in more detail below, circuit 400 may be formed on a yarn core of a core/sheath yarn, and the resulting yarn may be integrated with a plurality of electronically functional and/or non-functional yarns to provide an electronically functional textile. Circuit 400 may schematically represent the circuit formed on weft yarns 304B and/or 304C, for example. In FIG. 4 each diode-containing circuit element 402 is shown as comprising an electronic component 404 in series with a diode 406. For some circuit elements 402, electronic component 404 may be discrete and separate from diode 406, such as where the electronic component comprises a temperature sensor or other non-diode element. In other examples, electronic component 404 comprise an integrated diode junction, such as an LED.

FIG. 4 also illustrates how $n^2-n$ circuit elements may be controlled via n control lines using "Charlieplexing." In this arrangement, each control line 408A, 408B, 408C is connected to a corresponding pin 410A, 410B, 410C of a controller 412, and each pair of control lines is connected by a pair of diode-containing circuit elements having opposite polarities. By placing each pin 410 in a different one of three states (logical high, logical low, or high impedance), controller 412 may select the set of control lines through which current flows, as well as the direction of current flow, and thereby individually control each circuit element 402. For example, controller 412 may activate circuit element 402A, and none of the other circuit elements, by driving control line 408A in a high logical state (e.g., +5 V), driving control line 408A in a low logical state (e.g., 0 V), and effectively disconnecting control line 408C by placing its corresponding pin 410 in a high-impedance state. In contrast, to actuate circuit element 402B, and none of the other circuit elements, controller 412 may drive control line 408B in the high logical state, drive control line 408A in the low logical state, and place pin 410C in the high-impedance state. All circuit elements 402 may be individually controlled in this manner to provide outputs, read inputs (e.g. by sequentially reading each sensor of a plurality of sensors), and perform other suitable functions.

Figure 5:
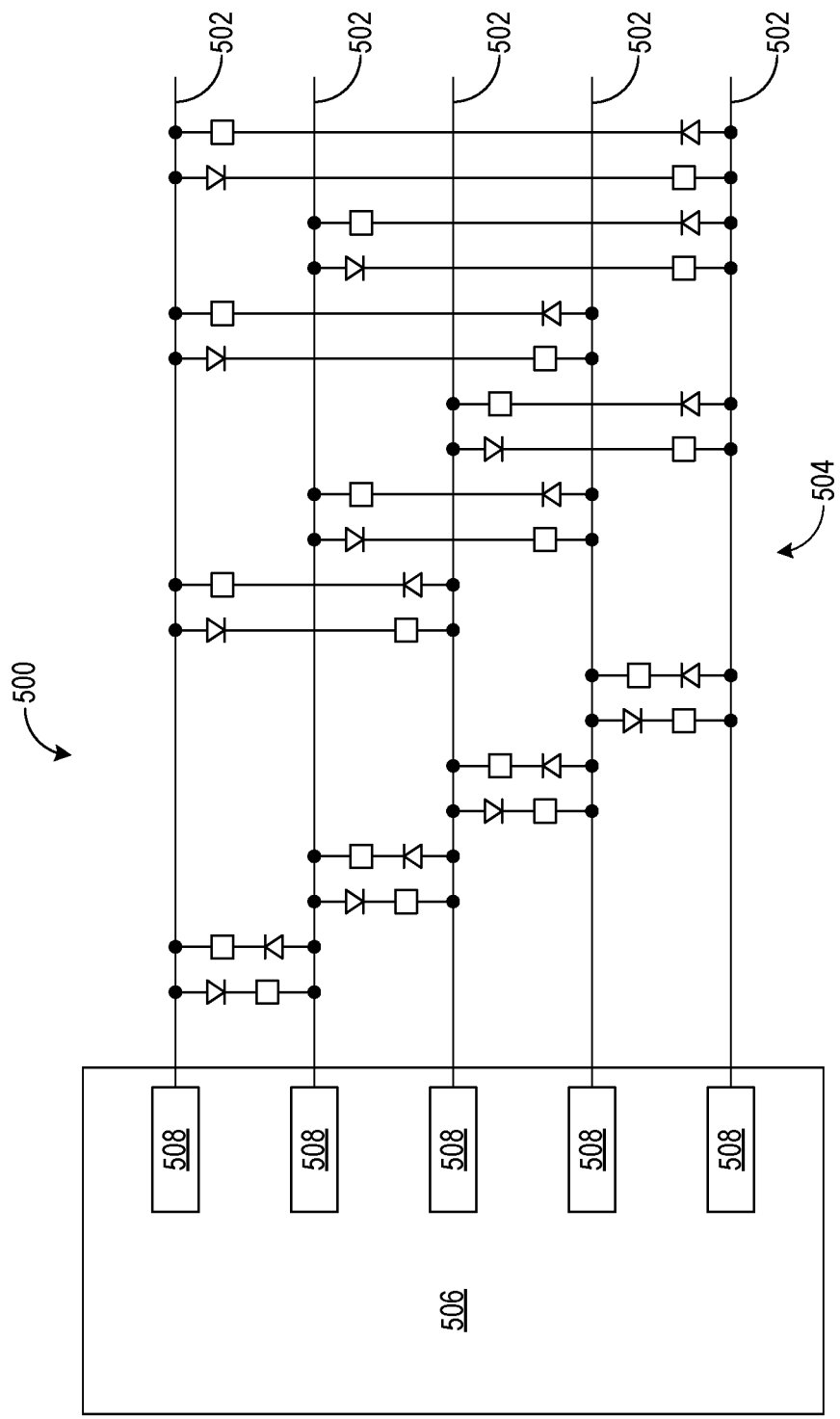
FIG. 5 schematically shows another example circuit for an electronically functional yarn.

As described above, control lines enable the control of $n^2-n$ circuit elements. FIG. 5 shows another example Charlieplexed circuit 500 with five control lines 502 operable to control twenty diode-containing circuit elements 504. Each circuit element 504 is individually controllable by a controller 506, which may control a particular circuit element by setting each control line of the circuit element to suitable logic states and setting the remaining control lines to high impedance states.

FIG. 6A illustrates an example electronically functional yarn 600 that may be incorporated into an electronically functional textile. Yarn 600 may represent yarns 304B and/or 304C of FIG. 3, for example, and is schematically shown in a partially unraveled configuration. Yarn 600 comprises a yarn core 602 including a core strip 604 that runs at least a portion of a length of the yarn. Core strip 604 may be formed as a cut section of a conductor-clad polymer membrane on which a conductive pattern (e.g. a plurality of control lines) is formed by patterning of the conductive cladding. The conductive pattern may be formed via a suitable photolithographic process, for example. In some examples, the core strip may be 100 to 300 microns wide and 50 to 100 microns thick. In other examples, core strip 604 may have other dimensions, whether wider/narrower and/or thicker/thinner. In some examples, core strip 604 may be a section detached from a conductor-clad polymer-membrane sheet of suitable thickness. Materially, the polymer-membrane section may comprise an elastomer for desirable flexibility. The polymer-membrane section may comprise a silicone or urethane polymer, for example. In other examples, the polymer-membrane section may comprise a styrene-butadiene epoxy resin. In implementations in which a bendable, but not necessarily stretchable, yarn is desired, the polymer-membrane section may include polyethylene tetraphthalate (PET), polyimide (PI), and/or polyethylene napthalate (PEN), for example. Other polymers, both natural and synthetic, may also be used.

In the depicted example, three electrically conductive traces 606 are formed on the polymer-membrane section and distributed over at least a portion of the length of core strip 604. In some examples, traces 606 may comprise copper (optionally plated with another metal or material). In some examples, traces 606 may be 10 to 200 microns in width (in some cases 10 to 50 microns in width), and 1 to 5 microns thick. In other examples, traces 606 may have any other suitable dimensions. In the example shown in FIG. 3A, core strip 604 has opposing sides, which each may support one or more electrically conductive traces. In some examples, traces 606 on opposing sides of the core strip 604 may be connected by an electrically conductive via passing through the core strip. In other examples, traces 606 may be arranged on one side only, and/or may have any other suitable dimensions than those described above. With three traces 606 arranged on core strip 604 as shown, FIG. 6A may represent an implementation of circuit 300 on yarn 600. Any suitable number of traces may be disposed on yarn 600, however, including five, as may be the case for an implementation of circuit 500 on the yarn. Yet other arrangements are possible, such as those in which traces are formed on more than two surfaces. For example, two or more double-sided structures (e.g., core strips) may be stacked using a dielectric adhesive, where each double-sided structure includes one or more traces arranged on each side. Conductive through-vias may electrically couple traces in different double-sided structures.

FIG. 6A also shows a plurality of electronic circuit elements 608 electrically coupled to electrically conductive traces 606 of core strip 604, in an interior portion of yarn 600. Elements 608, which may include discrete or integrated electronic-circuit elements, may be coupled to traces 606 via an electrically conductive adhesive, reflow soldering, or other suitable method. At least one electrical terminal 610 is arranged at terminus 612 of each trace 606. Terminal 610 enables the various electronic-circuit components of electronically functional yarn 600 to be addressed and/or powered (e.g., at least in part by controller 412 or 506). In some examples, terminal 610 may take the form of a cut end of one of traces 606, which may be cut anywhere along the length of the yarn.

Yarn core 602 also includes a carrier thread 614 to provide mechanical strength during winding, spinning, weaving, etc. In some examples, carrier thread 614 may comprise a plurality of wound or spun fibers or filaments. In other examples, carrier thread 614 may comprise a single, mechanically robust filament. Carrier thread 614 may be attached to core strip 604 in any of a variety of ways. Further, carrier thread 614 may span any suitable region(s) of core strip 604, including but not limited to the substantial entirety of the core strip (and potentially the length of the overall yarn 600). In some implementations, carrier thread 614 may be attached to the core strip 604 using a flexible adhesive, such as a suitable pressure sensitive adhesive, curable adhesive, or thermoplastic adhesive. In other implementations, carrier thread 614 itself may be formed from a thermoplastic material and bonded to the core strip 604 via the application of heat (and potentially with the application of suitable pressure). Any such bonding methods may be used at any suitable locations along the carrier thread 614 and core strip 604. FIG. 6B provides a cross-sectional, schematic view of yarn core 602, core strip 604, and carrier thread 614, in one example. In yet other examples, carrier thread 614 may be omitted.

Electronically functional yarn 600 may include one or more windings wrapped or spun around the core strip 604 and carrier thread 614 to thereby form a sheath 618. The windings may include electronically non-functional fibers. For clarity, FIG. 6A shows one such winding 616, but in practice many fibers may be wound around the core strip. In other examples, a plurality of non-functional, non-fibrous filaments may be wound around core strip 604 instead of, or in addition to, the electronically non-functional fibers. Suitable electronically non-functional fibers include raw fibers of wool, flax, cotton, hemp, and synthetic polymers. Suitable non-fibrous filaments include natural silk as well as synthetics. The material composition of sheath 618 may be selected in view of various criteria. For examples in which yarn 600 includes one or more LEDs, the material composition of sheath 618 may be selected such that light emitted by the LED(s) is not undesirably attenuated by the sheath. Materials suitable for this type of implementation may include nylon, for example. Further, some types of yarn posttreatments may be omitted to preserve desired light output, such as the application of brightening agents. These and other considerations may similarly apply to implementations in which yarn 600 comprises one or more sensing elements, where the congruence of sheath 618 with the sensing capabilities of the sensing elements is desired. In some examples, sheath 618 may comprise one or more yarns arranged around core strip 604.

Figure 7:
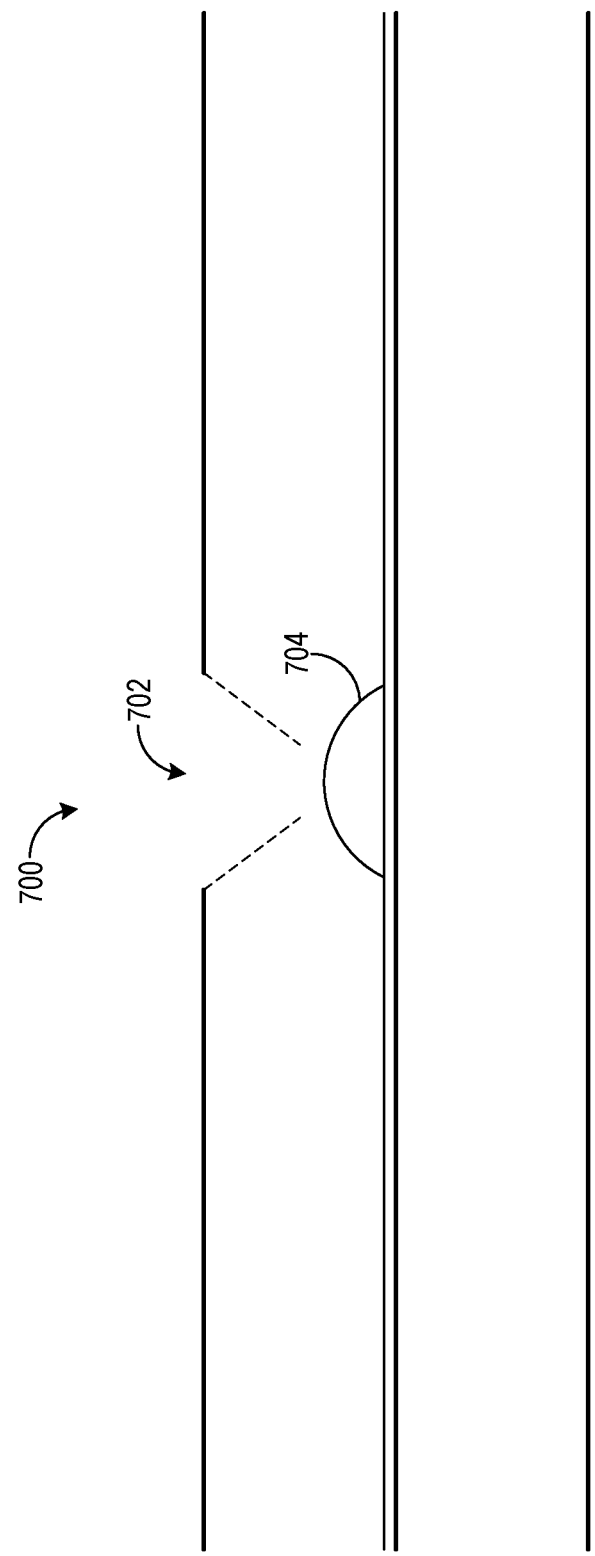
FIG. 7 shows a lengthwise cross-sectional view of an electronically functional yarn.

Sheath 618 may be electronically functional or non-functional. In electronically functional examples, the windings may include a conductive filament or thread that interfaces with one or more traces 606 on yarn core 602. In other examples, conductive filaments may be wound around core 602, then other fibers or filaments may be wound around the wrapped-core structure, thereby concealing the core and the conductive filaments wrapped around it. In still other examples, sheath 618 may be endowed with electrical conductivity via a posttreatment process in which, after forming yarn 600, the sheath is metalized. Sheath 618 may be configured for any suitable purpose—as an example, the sheath may comprise a thermoconductive material and may be configured as a heat exchanger. As another example, sheath 618 may comprise a conductive material and may be configured as an electrostatic discharge shield. As yet another example, sheath 618 may comprise an electrically insulating thread wound around electronically functional core 602 and may electrically insulate the electronic components integrated in yarn 600.

Where an electronically functional yarn comprises LEDs, attenuation of light output by the LED(s) by sheath 618 may be undesirable. As mentioned above, in some examples a sheath material may be selected to help reduce such attenuation. In other examples, yarn 600 may include one or more apertures formed over each LED, thereby providing openings for light emission. FIG. 7 schematically shows a cross-sectional view of a yarn 700 including an aperture 702 arranged at a location corresponding to a location of an LED 704. Apertures similarly may be used for other types of components, such as for sensors where unobstructed sensing is desired (e.g. photosensors, temperature sensors, chemical sensors). Aperture 702 may be formed in any suitable manner, such as by localized infrared heating, high-precision blade cutting, and/or deposition of a chemical solvent. In other examples, aperture 702 may be formed without removing a portion of the sheath; instead, as one example, one or more operational parameters of a covering machine used to form sheaths may be controlled to form the aperture, such as turns per inch and/or a tension setting. In some examples, aperture 702 may be included in the design of yarn 700, such that the aperture is formed along with the yarn.

Figure 8:
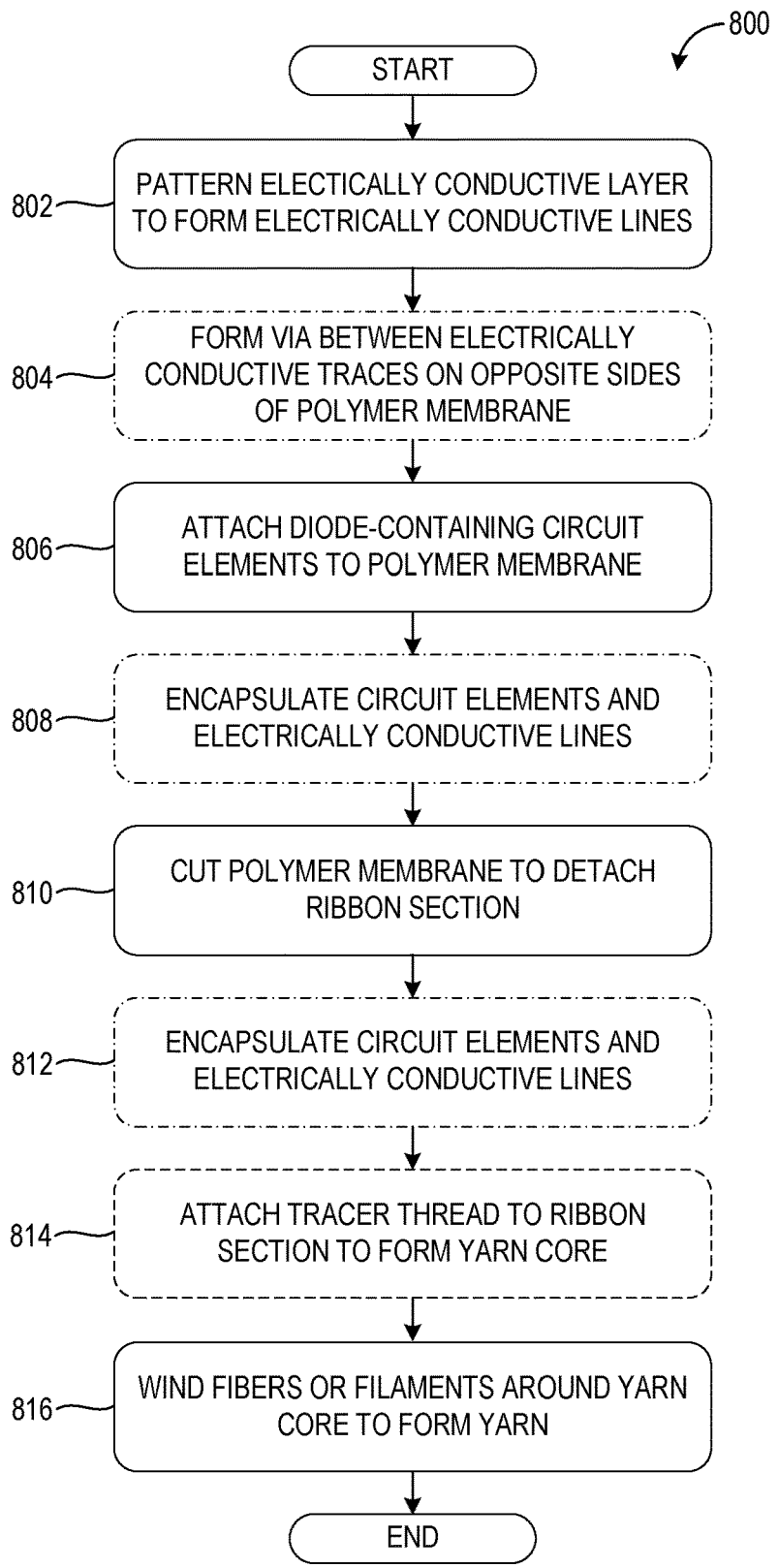
FIG. 8 illustrates an example method of making an electronically functional yarn.

FIG. 8 shows a flow diagram illustrating an example method 800 of making an electronically functional yarn. At 802, an electrically conductive cladding layer of a conductor-clad polymer membrane sheet is patterned to form an array of n electrically conductive lines on the polymer sheet, wherein n is equal to or greater than three. The conductor-clad polymer sheet may comprise, for example, a flexible polymer sheet coated on one or both sides with a thin layer of a conductor such as copper. In some examples, photolithography may be used to pattern the electrically conductive surface layer of the conductor-clad polymer sheet. The photolithography process may include application of a photoresist and selective curing of the photoresist by UV irradiation through a photomask. This process may be followed by a chemical etch to remove the copper from between the traces. In other examples, a resist may be applied via a stencil and cured without the aid of a mask. In still other examples, a screen-printing technique may be used to apply and/or pattern the conductive traces onto a polymer sheet. In some examples, the patterning aspect may include an optional step in which the electrically conductive lines formed by wet etching are overplated with nickel, tin, and/or another material, to discourage oxidation, increase strength, etc. The optional overplating step may include electroplating, electroless plating, or spray coating, as examples.

As noted above, the conductor-clad polymer sheet used to form a core strip may have an electrically conductive surface layer provided on each of the first and second opposing sides. Here, method 800 may include an optional step 804 of forming a via between the electrically conductive surface layer of the first side and the electrically conductive surface layer of the second side. A via may be formed, for example, by laser ablation (laser drilling) of a small locus of the patterned polymer sheet. The ablated locus may extend from a conductive line on one side of the sheet to a conductive line on the opposite side of the sheet. The ablated hole may then be filled with solder, conductive adhesive, or the like. In other examples, die punching may be used in lieu of laser ablation.

At 806 of method 800, a plurality of diode-containing circuit elements are attached to the n electrically conductive lines. Up to $n^2-n$ diode-containing circuit elements may be individually controlled, and more diode-containing circuit elements may be attached in instances where it is desired to activate more than one diode-containing circuit element in parallel via a same control output. The electronic components may be attached in any suitable manner, such as by using a conductive adhesive or soldering. In method 800, the circuit elements and conductive lines may be encapsulated prior to further processing to avoid detachment or damage during subsequent winding of the electronically functional yarn. Suitable encapsulants may include a polyurethane, polysiloxane, and/or epoxy-amine resin that remains flexible upon curing. In some examples, encapsulation may occur at 808, prior to cutting the sheet (with components attached) into sections.

At 810 the surface-modified polymer sheet is cut, thereby detaching a strip of the patterned polymer sheet. The strip detached in this manner still supports the n electrically conductive lines, which are distributed over at least a portion of a length of the strip, and the plurality of circuit elements arranged on the strip. Mechanical micro-machine cutting and/or laser ablation (laser machining) may be used to cut away the section, as examples. The polymer sheet may be cut in various directions—for example, the sheet may be cut in a lateral direction to obtain longitudinally separated strips. Alternatively or additionally, multiple patterned yarn cores may be formed in parallel on a common substrate, and then cut in a longitudinal direction to obtain separated strips.

While the attachment of diode-containing circuit elements to the polymer membrane at 806 is illustrated as taking place prior to cutting the polymer membrane at 810, in other examples the circuit elements may be attached to the polymer membrane after cutting the polymer membrane.

At 812 of method 800 an optional encapsulation step may be used. Encapsulation after the cutting may be used, for example, when a continuous film of robust encapsulant over the entire surface of the core strip is desired. A plurality of strips may be cut from the patterned polymer sheet in this manner to form a plurality of yarn cores.

At 814 the encapsulated core strip may optionally be attached to a carrier thread, which provides mechanical robustness during subsequent spinning of the various electronically non-functional fibers and/or filaments around the core strip. In some implementations, the carrier thread may be secured to the core strip using an adhesive, such as a curable material or a pressure-sensitive adhesive. In other examples, the carrier thread may be formed from a thermoplastic material that can be bonded via heat to the core strip. Further, in some examples, the core strip may be attached to a carrier thread at a different location in the process than that shown in FIG. 8.

At 816, a plurality of fibers and/or filaments (as described above) are wound around the yarn core to form an electronically functional yarn. It will be noted that method 36 may be enacted in a roll-to-roll process, for efficiency of manufacture.

Figure 9:
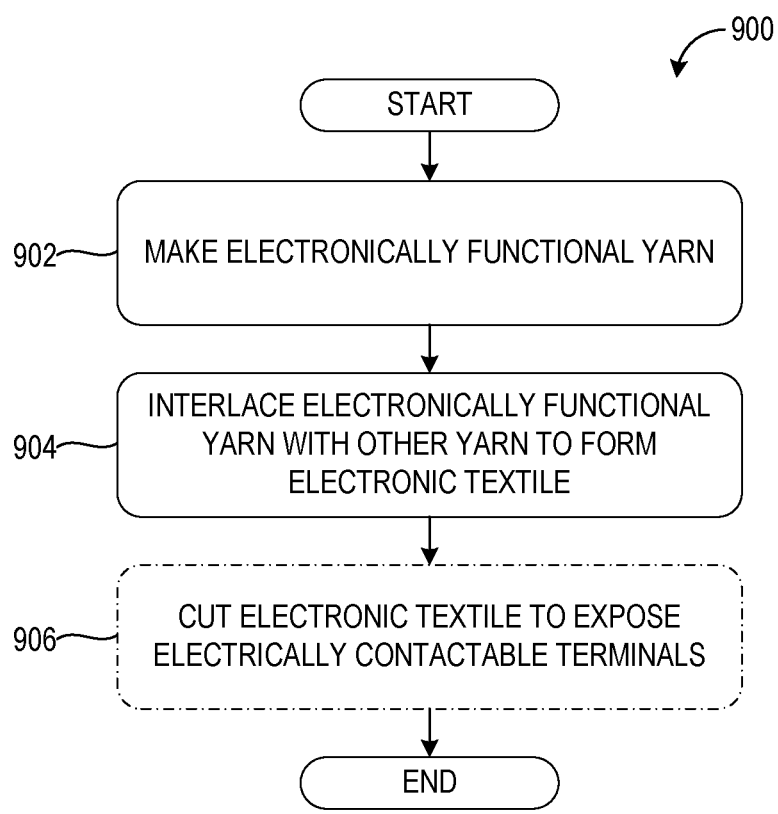
FIG. 9 illustrates an example method of making an electronically functional textile comprising an electronically functional yarn.

FIG. 9 illustrates an example method 900 of making an electronic textile using an electronically functional yarn, such as the yarn made in method 800 of FIG. 8. At 902 of method 900, an electronically functional yarn is made. In some examples, a process other than method 800 may be used to form the electronically functional yarn. At 904 the electronically functional yarn is interlaced with a plurality of electronically functional and/or non-functional yarns to form the electronic textile. Interlacing the yarns may include one or more of weaving, knitting, crocheting, bonding, knotting, felting, and embroidering. At optional step 906, the electronic textile is cut. In cutting the electronic textile, the electronically functional yarn and associated strip are segmented to expose at least one electrically contactable terminal, which may simply be a terminus of the one or more conductive lines, or may comprise a conductive pad. One or more of these terminals may be connected to a source of power or electronic signal, as described above. In other examples, the electronic componentry of the yarn may be addressed and/or powered via unwidened traces or conductive pads arranged on an interior portion of the strip (away from any locus where the yarn is cut). As noted above, conductive lines or pads may be exposed by unraveling a small portion of the yarn where contact is desired. In other implementations, as noted above, the conductive pads may be attached to conductive filaments, fibers, or wires generally. Such wires may be unraveled and exposed at the ends of any segment of electronically functional yarn.

Another example provides an electronically functional yarn comprising a core, a sheath at least partially surrounding the core, and an electronic circuit formed on the core, the circuit including three or more control lines and more than three diode-containing circuit elements controllable by the three or more control lines, each circuit element being controllable via a corresponding set of two of the three or more control lines. In such an example, one or more of the circuit elements may comprise an input device in electrical series with a diode. In such an example, the input device may comprise one or more of an infrared light sensor, a visible light sensor, an acoustic sensor, a pressure sensor, an antenna, a chemical sensor, and a haptic actuation device. In such an example, one or more of the circuit elements alternatively or additionally may comprise an output device. In such an example, the output device may comprise one or both of a light-emitting diode and a haptic feedback device. In such an example, the output device may be in electrical series with a diode. In such an example, the electronically functional yarn may be incorporated into a textile comprising a plurality of electronically non-functional yarns. In such an example, the electronically functional yarn may be one of a plurality of electronically functional yarns that form an array of diode-containing circuit elements incorporated in the textile. In such an example, the electronically functional yarn alternatively or additionally may comprise a controller operatively coupled to the electronic circuit. In such an example, the controller may be configured to sequentially read input from one or more of the circuit elements. In such an example, the sheath may comprise a thermoconductive material and may be configured as a heat exchanger. In such an example, the sheath alternatively or additionally may comprise a conductive material and may be configured as an electrostatic discharge shield. In such an example, the sheath alternatively or additionally may comprise one or more apertures each arranged at a location corresponding to a location of a respective circuit element. In such an example, the sheath alternatively or additionally may comprise an electrically insulating yarn wound around the electronically functional core.

Another example provides an electronically functional textile comprising a plurality of electronically non-functional yarns, and one or more electronically functional yarns, each electronically functional yarn comprising a core, a sheath at least partially surrounding the core, and an electronic circuit formed on the core, the circuit including three or more control lines and more than three diode-containing circuit elements controllable by the three or more control lines, each circuit element being controllable via a corresponding set of two of the three or more control lines. In such an example, one or more of the circuit elements may comprise an input device in electrical series with a diode. In such an example, the input device may comprise one or more of an infrared light sensor, a visible light sensor, an acoustic sensor, a pressure sensor, an antenna, and a chemical sensor.

Another example provides a method of making an electronic textile, the method comprising patterning an electrically conductive surface layer of a conductor-clad polymer strip to form three or more electrically conductive lines on the polymer strip, attaching a plurality of diode-containing circuit elements to the three or more electrically conductive lines, cutting the polymer strip to detach a section of the polymer strip, with one or more of the electrically conductive lines on the section, and one or more of the diode-containing circuit elements arranged on an interior portion of the section, and forming a sheath around the section of the polymer strip. In such an example, the plurality of diode-containing circuit elements may be attached to the three or more conductive lines prior to cutting the polymer strip. In such an example, forming the sheath may comprise forming an electrically insulating sheath.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronically functional yarn, comprising:
   a core;
   a sheath at least partially surrounding the core, the sheath comprising one or more electronically non-functional windings; and
   an electronic circuit formed on the core, the circuit including three or more control lines and more than three diode-containing circuit elements controllable by the three or more control lines, each circuit element being controllable via a corresponding set of two of the three or more control lines.

2. The electronically functional yarn of claim 1, wherein one or more of the circuit elements comprises an input device in electrical series with a diode.

3. The electronically functional yarn of claim 2, wherein the input device comprises one or more of an infrared light sensor, a visible light sensor, an acoustic sensor, a pressure sensor, an antenna, a chemical sensor, and a haptic actuation device.

4. The electronically functional yarn of claim 1, wherein one or more of the circuit elements comprises an output device.

5. The electronically functional yarn of claim 4, wherein the output device comprises one or both of a light-emitting diode and a haptic feedback device.

6. The electronically functional yarn of claim 4, wherein the output device is in electrical series with a diode.

7. The electronically functional yarn of claim 1, wherein the electronically functional yarn is incorporated into a textile comprising a plurality of electronically non-functional yarns.

8. The electronically functional yarn of claim 7, wherein the electronically functional yarn is one of a plurality of electronically functional yarns that form an array of diode-containing circuit elements incorporated in the textile.

9. The electronically functional yarn of claim 1, further comprising a controller operatively coupled to the electronic circuit.

10. The electronically functional yarn of claim 9, wherein the controller is configured to sequentially read input from one or more of the circuit elements.

11. The electronically functional yarn of claim 1, wherein the sheath comprises a thermoconductive material and is configured as a heat exchanger.

12. The electronically functional yarn of claim 1, wherein the sheath further comprises a conductive material and is configured as an electrostatic discharge shield.

13. The electronically functional yarn of claim 1, wherein the sheath further comprises one or more apertures each arranged at a location corresponding to a location of a respective circuit element.

14. The electronically functional yarn of claim 1, wherein the sheath comprises an electrically insulating yarn wound around the electronically functional core.

15. An electronically functional textile, comprising:
   a plurality of electronically non-functional yarns; and
   one or more electronically functional yarns, each electronically functional yarn comprising
      a core;
      a sheath at least partially surrounding the core, the sheath comprising one or more electronically non-functional windings; and
      an electronic circuit formed on the core, the circuit including n control lines and up to $n^2-n$ diode-containing circuit elements, each circuit element being controllable via a corresponding set of two of the n control lines, n being greater than or equal to three.

16. The electronically functional textile of claim 15, wherein one or more of the circuit elements comprises an input device in electrical series with a diode.

17. The electronically functional textile of claim 16, wherein the input device comprises one or more of an infrared light sensor, a visible light sensor, an acoustic sensor, a pressure sensor, an antenna, and a chemical sensor.

* * * * *